US012463661B1

(12) United States Patent
Michoski

(10) Patent No.: US 12,463,661 B1
(45) Date of Patent: Nov. 4, 2025

(54) METHOD FOR NONLINEAR SYSTEM IDENTIFICATION FOR MASSIVE DATA COMPRESSION

(71) Applicant: Craig Michoski, Austin, TX (US)

(72) Inventor: Craig Michoski, Austin, TX (US)

(73) Assignee: Sophelio LLC, Austin, TX (US)

( * ) Notice: Subject to any disclaimer, the term of this patent is extended or adjusted under 35 U.S.C. 154(b) by 318 days.

(21) Appl. No.: 18/139,338

(22) Filed: Apr. 25, 2023

Related U.S. Application Data

(60) Provisional application No. 63/334,352, filed on Apr. 25, 2022.

(51) Int. Cl.
   *H03M 7/00* (2006.01)
   *H03M 7/30* (2006.01)

(52) U.S. Cl.
   CPC ....... *H03M 7/6011* (2013.01); *H03M 7/3066* (2013.01)

(58) Field of Classification Search
   CPC ............ H03M 7/6011; H03M 7/3066
   USPC ..................................... 341/50, 51
   See application file for complete search history.

(56) References Cited

U.S. PATENT DOCUMENTS

| | | | |
|---|---|---|---|
| 11,139,827 B2 * | 10/2021 | Ki | H03M 7/6011 |
| 11,722,148 B2 * | 8/2023 | Fruchtman | H03M 7/3068 |
| | | | 341/50 |
| 2014/0222749 A1 * | 8/2014 | Fernandez Martinez | G01V 20/00 |
| | | | 706/52 |
| 2020/0083902 A1 * | 3/2020 | Martens | H03M 7/30 |

* cited by examiner

*Primary Examiner* — Jean B Jeanglaude
(74) *Attorney, Agent, or Firm* — Dorius Law PC; Kirk Dorius

(57) ABSTRACT

A method for compressing and encoding relational aspects of high-dimensional, potentially highly-nonlinear, possibly inter-dependent, data systems has been developed, providing the ability to efficiently encode, validate, interpret, enhance, and design improved devices, algorithms, and systems. This procedure additionally allows for the easy incorporation of analysis and identification procedures for understanding the ways in which complex systems operate, as well as the ability to control, compress, predict, simulate, assess, analyze, and describe these systems in concise and easily understandable ways.

21 Claims, 8 Drawing Sheets

METHOD FOR NONLINEAR SYSTEM IDENTIFICATION FOR MASSIVE DATA COMPRESSION

CROSS-REFERENCE TO RELATED APPLICATIONS

This application claims priority to provisional application 63/334,352 titled "METHOD FOR NONLINEAR SYSTEM IDENTIFICATION FOR MASSIVE DATA COMPRESSION" and is incorporated herein in its entirety.

FIELD OF INVENTION

This invention generally relates to measured high-dimensional, and/or multimodality data systems that are natural or engineered, which are too complex to a priori predict with high accuracy (and validate against) but have implicit and latent relational structures present in the data that—if properly processed—are in fact both descriptive and predictive of the underlying processes driving the system, and capable of being used for system compression, analysis, and various other downstream uses.

BACKGROUND OF THE INVENTION

Various methods and means have been proposed for system identification, data discovery, data downsampling, and data compression, however none have been able to with similar efficiently extract from high-dimensional data systems, the fully-coupled, sample-based dynamical and relational systems that additionally compress the data to a high data-compression-ratio while still preserving the interpretability and representational fidelity of the system.

A common feature of previous system identification tools is the reliance on purely algebraic, and occasionally, differential forms (e.g. derivatives with respect to independent variables). In addition, many system identification tools also allow for the use of different basis sets when searching for functions, e.g. searching for only elementary function representations.

A common problem, however, associated with previous system identification techniques is while these tools are effective in some cases, they tend to be either: 1) too rigid in their representational framework to capture complex data sets to highly accurate validation and/or prediction, and/or 2) lead to highly-complicated and intuitively-impenetrable representations that provide very little actionable insight into the underlying relationships they encode, and/or 3) are prohibitively computationally expensive and data thirsty, and/or 4) are unable to accommodate sample-based systems with uncertainty as observed in many real-world applications, and/or 5) are more concerned with trying to match system data to classical "first principle" (or traditional) models, than in utilizing such toolchains to encode the most parsimonious models (or representations) available.

A common feature of previous tools for data compression includes a lack of interpretability and the absence of relational information about the underlying data encoded along different data dimensions.

A common problem associated with previous compression algorithms (in the present context) is while these tools are also effective in many cases, standard data compression algorithms treat data as independent data streams and tries to find ways of compressing these data streams for the sake of only data retrieval; hence encoding no usable information about hidden relational structures along separable, and/or separate, data streams.

Accordingly, improvements are sought for finding compression techniques that are not only efficient and lossless (or as close to lossless as possible), but which encode the relational content of the data streams for system discovery, deep analysis, and many other downstream data-enabled capabilities. Additionally, improvements are sought for finding representations that are more intuitive, more accurate, more efficient, and more actionable.

SUMMARY OF THE INVENTION

While the way that the present invention addresses the disadvantages of the prior art will be discussed in greater detail below, in general, the present invention provides a more accurate, more efficient, more intuitive, and more actionable way of encoding complex relationships between variables in observable systems than do traditional computational and theoretical models, machine learning and artificial intelligence techniques, and state-of-the-art system identification approaches. The invention provides the ability to extract and characterize these relationships from data for use in myriad downstream applications.

One aspect of the invention features, in some embodiments, the ability to significantly reduce the degrees of freedom characterizing the dynamic, spatial, and/or phase-space relationships present/hidden within complex data sets.

In some embodiments the tool allows for the ability to test and compare the validation accuracy and predictive capabilities of traditional and/or classical first-principle models to the models discovered from, and implicit to, observational (e.g. empirical) reality.

In some embodiments the statistical nature of observed phenomena leads to sample-based observations, where uncertainties in the measurements (e.g. aleatoric and/or epistemic) due to various physical and/or material limitations can make deterministic models inappropriate or difficult to justify. In these circumstances the tool is uniquely able to preserve the implicit sample-based uncertainty and stochasticity of the system, while still leading to highly predictive model frameworks, that compress the relational information latent in the data.

In various embodiments, the invention provides for the ability to extract deep, yet relatively simple, nonlinear differential relationships between, for example, system controls in an industrial-control-systems setting.

In other embodiments, the ability to extract natural dynamical systems inferred through partial differential equations with parametric stochasticity, can reveal deep insights into natural and engineered phenomena.

Another aspect of the invention features, in some embodiments, the ability to provide real time control over rapidly-generated data streams, while naturally preserving the physical and practical constraints necessary to effectively optimize industrial and commercial processes. This application allows for uniquely efficient real time visualization capabilities as well.

In some embodiments these real time control systems may lead to fully autonomous control systems that are able to find global (over the supported parameter space) optima.

In other embodiments the real time control systems that the invention enables are able to operate with high accuracy and efficiency, automating the ability to rapidly guide systems towards local optima.

In some embodiments, the ability to generate highly accurate time series predictions of complex multimodality systems is possible. The resulting algorithms are more physically interpretable, more computationally efficient, more accurate, and generalizable than conventional time-series prediction methods, such as autoregression, XGBoost, or Neural Networks.

In other embodiments, the invention allows for the ability to extract representational frameworks, which can then be encoded in forward models and used to simulate (e.g. the Simulation Module 900) and calculate "artificial" and/or "hypothetical" scenarios, providing the ability to generate, e.g. digital twins of complex multimodal data systems.

In many embodiments, the invention allows for the ability to perform tasks currently performed by modern machine learning techniques, e.g. regression, classification, etc., in a more computationally efficient way, leading to more intuitively interpretable results in more compact forms.

Another aspect of the invention features, in some applications, a method to selectively examine the relationship between correlated data and to determine whether the resulting relationship can be described as being merely correlated or is in fact causally linked, by use of standard counterfactual analysis.

In some applications, the invention allows for the ability to test feature selection algorithms to determine how effective they are at identifying the probabilities of correlations in the data.

At its core, the invention provides the ability to encode complex relationships between data in a parsimonious, lossless, and/or near lossless way, which can be used in a wide array of algorithms, applications, and devices.

The present invention contemplates various mechanisms for encoding the intrinsic underlying structure of coincident data sets as efficiently and accurately as possible, while maintaining a conceptually simple interpretive frame in which human operators are able to analyze, assess, and design.

Another aspect of the invention features, in some implementations, a system identification method for extracting deep latent relationships present within multimodal and/or multidimensional data, by identifying underlying dynamic and variational relationships present within, and among, data subgroupings. The method includes identifying targets (variables, vectors, or data subsets) in multimodal, multidimensional, and/or multi-dimensionalizable data sets to find representations of the targets in terms of the other modes, or data subgroupings, from the full data set; extracting representations in the form of either dependent and/or independent variables of simple algebraic form and order, along with their integrals along varying dimensions or dependencies, and their derivatives with respect to each other (including temporal, spatial, partial, and/or "phase derivatives" of low degree); using the extracted representations to discover parsimonious (or near parsimonious) representations of the input data, in the expression of simple differential-type equations; and encoding and storing the parsimonious representations for later retrieval, data reconstruction, analysis, and/or downstream use.

Another aspect of the invention features, in some implementations, a data discovery method for compressing and encoding relational aspects of high-dimensional, highly-interdependent, largely-independent, multimodal, and/or nonlinear data systems. The method includes identifying targets (variables, vectors, or data subsets) in multimodal, multidimensional, and/or multi-dimensionalizable data sets to find representations of the target in terms of the other modes, or data subgroupings, from the full data set; developing a comprehensive dependency tree (including both dependent and independent variables of arbitrary algebraic form and order, their integrals along varying dimensions, and their derivatives with respect to each other, such as temporal, spatial, partial, and/or "phase derivatives" of arbitrary order and/or mixed degree); extracting deep (potentially non-intuitive) latent representations present in the data in the form of complex differential-type encodings, including at least one of partial differential equations (PDEs), ordinary differential equations (ODEs), stochastic differential equations (SDEs), dynamical systems, PDEs with stochastic coefficients and constant terms, algebraic differential equations (ADEs), and integro-differential equations; using the extracted representations to discover parsimonious (or near parsimonious) representations of the input data, in the expression of complex differential-type equations; and encoding and storing the parsimonious representations for later retrieval, data reconstruction, analysis, and/or downstream use.

In some implementations, the method further includes performing transfer learning between similar, or seemingly disparate data systems, in order to transfer knowledge from one domain knowledge area to another.

Another aspect of the invention features, in some implementations, a numerical compression method for extracting derived, latent features from multidimensional (or multi-dimensionalizable) data sets. The method includes transforming symbolic results from earlier method implementations into digitized versions of numerical and symbolic representations; extracting the deep relationships in the data encoded into families of differential-style equations and the coinciding residuals associated to the numerical approximations representing differential (e.g. finite difference/volume/element, automatic differentiation, spectral, etc.) and integral (e.g. quadrature, cubature, sparse grids, etc.) forms; generating computationally invertible (and/or pseudo-invertible) mappings between the forward and reverse numerical and algebraic representations of the differential and integro-differential forms; training the representational numerical forms to be substantially parsimonious, relative to user assigned constraints, limits, or in-built assumptions (e.g. biases); optimizing the representational numerical forms to balance the needs of the application at hand (e.g. including the size of the residual alongside the sensitivity in the reconstruction); and storing the optimal representations for later use.

In some implementations, the prescribed efficiency of the encoding of the data relationships leads to theoretical parsimony limits relative to optimal data validation, and thus unique, novel, and non-degenerate representations of complex data systems.

In some implementations, transfer learning is performed between similar, or seemingly disparate data systems, in order to transfer knowledge from one domain knowledge area to another.

In some implementations, re-calibration, tuning, and/or hypertuning is performed to find more optimal representations of the data system, e.g. more efficient and/or accurate, leading to better compression ratios (greater parsimony), more accurate predictions, and greater levels of conceptual insight into the data system under consideration.

In some implementations, the method further includes visualizing and aggregating for extracting information and or knowledge about the system; statistically analyzing the resulting statistical data representations; analyzing the sensitivities in the resulting data representations; performing counterfactual analysis on the resulting data representations, to determine the relationships implicit in the data system as revealed by the resulting data representations; prescribing data anomalies, cluster locations, and predictive tendencies in the resulting data representations; and performing dimension reduction techniques for comparison and analysis.

In some implementations, the method further includes assigning of control objectives; setting operational constraints on the objective function; updating the datastream with new data, as it is acquired; (optionally) retraining the representations based on the new data coming from the datastream update; and automating the control processes in real time, or on time horizons pertinent to the evolution or decision time-frame of the data systems under consideration.

In some implementations, the method further includes extracting inter-related features of the system; encapsulating real and complex high-order epiphenomena efficiently; and storing the discovered integrated epiphenomena into a Meta-Encoding Module.

In some implementations, the method further includes reconstructing the data predicted from the stored representation, and running forward simulations that can be used to predict and/or analyze system behavior.

In some implementations, the method further includes collecting and loading the predictive inference and statistical properties gathered in the Analysis Module; identifying the likelihood, and/or probabilities of unplanned or undesirable events occurring in the system generating the data; assessing the uncertainty in the predicted event probability relative to known, or ideal, behaviors of the system generating the data; deciding on admissible risk tolerances for a performed operation; and automating risk assessment and decision making.

An outstanding advantage, and core component, of the present invention is that it works on a broad collection of data types and formats, where time-series, simply spatial, phase-space, or even visual or audio-based, e.g. video and/or image, data types can all be easily ingested and interpreted within its framework. In addition, the present framework allows for the unique possibility that all explicitly observed phenomena within a system are mutually dependent variables of all other explicitly observed phenomena in the system, leading to nested interdependency trees. These inferred interdependencies lead to the concept of "phase derivatives," which are differential relationships between variables under the assumption that one variable may be viewed (provisionally) as a dependent variable of any other, and one of the key components to the differential relationships that become discoverable.

Depending on the application and data type used, the resulting data compression ratio could be theoretically optimal for encoding the relational knowledge latent inside the system, and subsequently impossible, when restricted to current knowledge and classical and/or even quantum computing constraints, to improve upon.

An alternative embodiment, however, utilizes the data compression and representational power of the invention to improve, enhance, and modify more classical machine learning techniques, for example reinforcement learning algorithms, Bayesian optimization, or symbolic AI.

The key advantage of the present invention is the ability to compress complex functional relationships into parsimonious symbolic representations. It is also possible, however, for the tool to be used in classical machine learning workflows. For example, utilizing the outputs from the tool in a DNN for meta-analysis over different embodiments of data generating systems, e.g. comparing representational forms from different systems.

BRIEF DESCRIPTION OF THE FIGURES

A more complete understanding of the present invention may be derived by referring to the detailed description and claims when considered in connection with the Figures.

DETAILED DESCRIPTION

Figure 1:
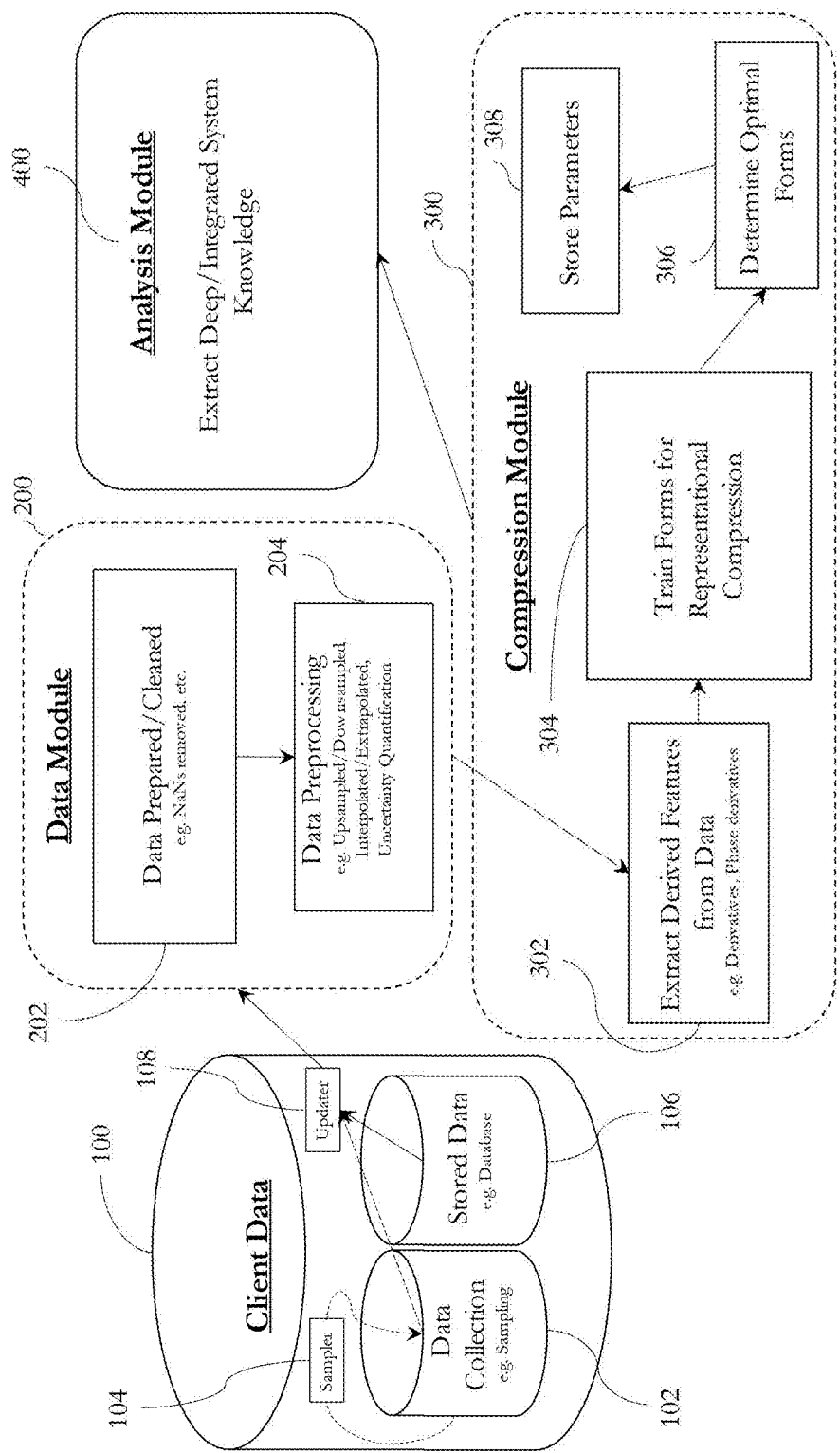
FIG. 1 illustrates how the invention is most simply incorporated by taking Client Data 100, porting through data preprocessing (i.e. the Data Module 200) to extract compressed representations (i.e. the Compression Module 300), which can be used for deep data analysis in the Analysis Module 400.

The following description is of exemplary embodiments of the invention only and is not intended to limit the scope, applicability, or configuration of the invention. Rather, the following description is intended to provide a convenient illustration for implementing various embodiments of the invention. As will become apparent, various changes may be made in the function and arrangement of the elements described in these embodiments without departing from the scope of the invention as set forth herein. It should be appreciated that the description herein may be adapted to be employed with alternatively configured devices and workflows having different shapes, components, mechanisms, orders of operation, and the like and still fall within the scope of the present invention. Thus, the detailed description herein is presented for purposes of illustration only and not of limitation.

Reference in the specification to "one embodiment" or "an embodiment" is intended to indicate that a particular feature, structure, or characteristic described in connection with the embodiment is included in at least an embodiment of the invention. The appearances of the phrase "in one embodiment" or "an embodiment" in various places in the specification are not necessarily all referring to the same embodiment.

In the following description, certain terminology is used to describe certain features of one or more embodiments of the invention. For example, the term "data compression" as described herein may include, but is not necessarily limited to, the reduction in the required number of degrees of freedom necessary to encode an intrinsic correlative/causal, or otherwise, relationship implicit—or latent—within a data set. However, when applied specifically to the application of the invention itself, "data compression" uniquely describes a procedure that implies the forms the resulting representations take, even when these resulting forms may, in principle, be constructed from a wide variety of optimization procedures including those common in, but not necessarily limited to, NNs, linear or nonlinear regression techniques, autoencoders, generative frameworks, reinforcement learning approaches, etc.

In accordance with various aspects of the present invention, the ability to reduce the representational complexity of data can provide extraordinary advantages in practical contexts. For example, the present invention may be used to not only reduce the degrees of freedom required to encode a near lossless representation of data, but also to reveal humanly interpretable forms exposing potentially deep intuitive knowledge of the implicit and hidden relationships present within, and between, various aspects of the data. That being said, the present invention described herein in the exemplary context of data compression and parsimonious relational representations, offers a tool with broad scope and potentially deep ramifications for computational sciences, including within areas touching artificial intelligence, machine learning, computer science, computational engineering, etc.

The term "sampling" or "sample" as used herein, includes any method of acquiring repeated observations from a system regardless of the specific statistical properties of those samples, e.g. whether they are biased, complete, all drawn from the same statistical population, etc. Suitable "samples" may include any collection of observations able to be compared, correlated, or causally linked to each other. The term "realization" used herein refers to the value of an observation, or observed value, of a random variable actually observed in a sampling process.

The term "complex" used herein is generally used to describe "consisting of many different and connected parts."

The term "Analysis" used herein, generally may be construed to mean any application of the invention that provides insight into the elements or structure of a process or relationship present within a data system itself. The term "real-time control" used herein refers to systems capable of being guided or operated in real time, i.e. on a time scale pertinent to the practical operation—and updating of that operation—of the control system.

The term "Functor" used herein refers to the potential existing functional (or functorial) relationships present within system datasets that are deeply integrated across systems or subsystems, i.e. include increasingly more conjunctive operational relationships, that are able to describe insights into correlative, causal, or hypostatic principles that can be, for example, either predictive or descriptive in nature.

The term "hazard" used herein refers to any "condition, event, or circumstance that could lead to or contribute to an unplanned or undesirable event."

It is understood that any process now known or later developed for forming data-predictive and/or data-descriptive models may be used in accordance with the present invention.

This invention is primarily concerned with high-dimensional and/or multi-modal data systems, either naturally occurring or engineered, that are too intricate to accurately predict and validate beforehand. However, these systems contain hidden and latent relationships within the data, which, when appropriately processed, can effectively describe and forecast the underlying processes governing the system. Furthermore, this processed information can be employed for system compression, analysis, and a range of other subsequent applications.

An advantage of the present invention is that it applies to a very broad collection of data types and formats, where time-series, simply spatial, phase-space, or even visual or audio-based, e.g. video or images, data types can all be easily ingested and interpreted within its framework. In other words, any digitized data format is an admissible data set, including serialized data which may be easily re-framed as multidimensional data vectors by merely splitting or parsing it in various ways. In addition, the present framework allows for (though in no way requires) the possibility that all explicitly observed phenomena within a system be understood as mutually dependent variables of all other explicitly observed phenomena in the system, leading to nested interdependency trees. These inferred interdependencies lead to the concept of "phase derivatives," which are differential relationships between variables under the assumption that one variable may be viewed (provisionally) as a dependent variable of any other, e.g. given any two variables g and f, we may always assume either that g=g(f) (that is, g is a function of f) or f=f(g) (that is, f is a function of g) and compute the resulting first order "phase derivatives" $\partial f/\partial g$ or $\partial g/\partial f$, or phase derivative to any order (or degree), being either pure (e.g. $\partial^2 f/\partial^2 g$) or mixed (e.g. $\partial^2 f/\partial g \partial h$, where h here is any third variable), etc. Note that the "physical laws," or human interpretation of those laws, that imply specific concrete dependencies (e.g. pressure p being a function of space x and time t, p(t,x)) do not of necessity restrict the dependency purview of potentially admissible phase derivatives in the system under consideration, which provisionally may use, and truncate, any dependency tree for convenience and exploration, e.g. x(p), t(x), x(t(p)), etc.

The invention has been successfully used to extract evolution equations of global plasma parameters as a function of plasma control parameters in pulsed plasma experiments, such as tokamaks in fusion energy. In one case, the target was to relate the rate of change of the plasma impurities to plasma control parameters, such as the loop voltage and injected power. In total, the search space consisted of 25 different diagnostic and control signals. A model discovered, for example, is:

$$\frac{\partial I}{\partial t} = C_1 + C_2 \frac{\partial I}{\partial V_{loop}} + C_3 \frac{\partial V_{loop}}{\partial t} \frac{\partial I}{\partial P_{inj}} + \tag{1}$$

$$C_4 \frac{V_{loop}}{\partial t} \frac{\partial I}{\partial P_{oh}} + C_5 I \frac{\partial I}{\partial P_{inj}} + C_6 \left(\frac{\partial I}{\partial \mathcal{T}_{top}}\right)^2$$

Figure 7:
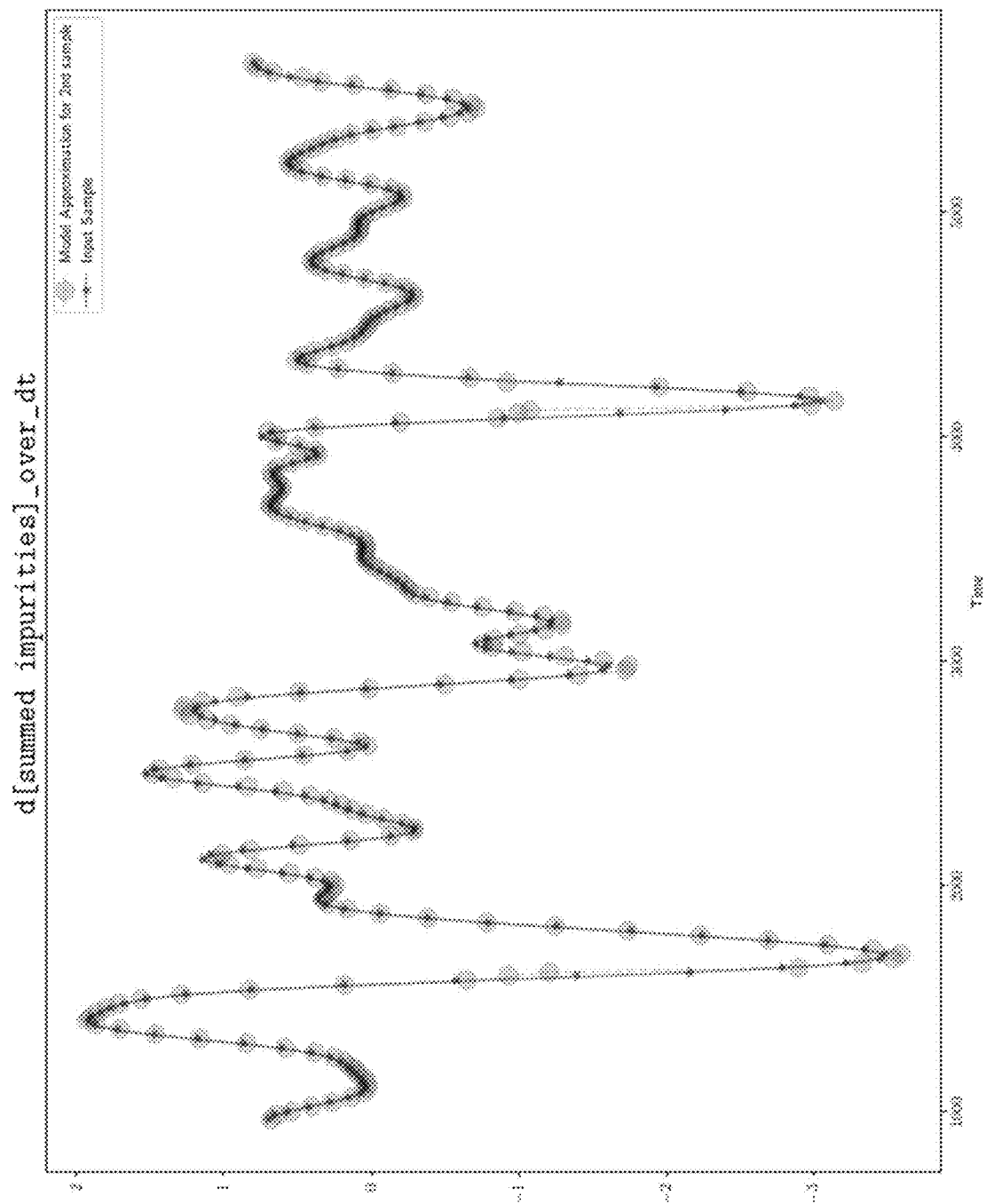
FIG. 7: One statistical realization (or sample) of the discovered system shown in Equation (1) for the rate of change of the summed impurities in a plasma experiment, where the measured input (true value) is shown as a solid line marked by stars, and the model predicted approximation is shown as a dashed line marked by circles.
Figure 8:
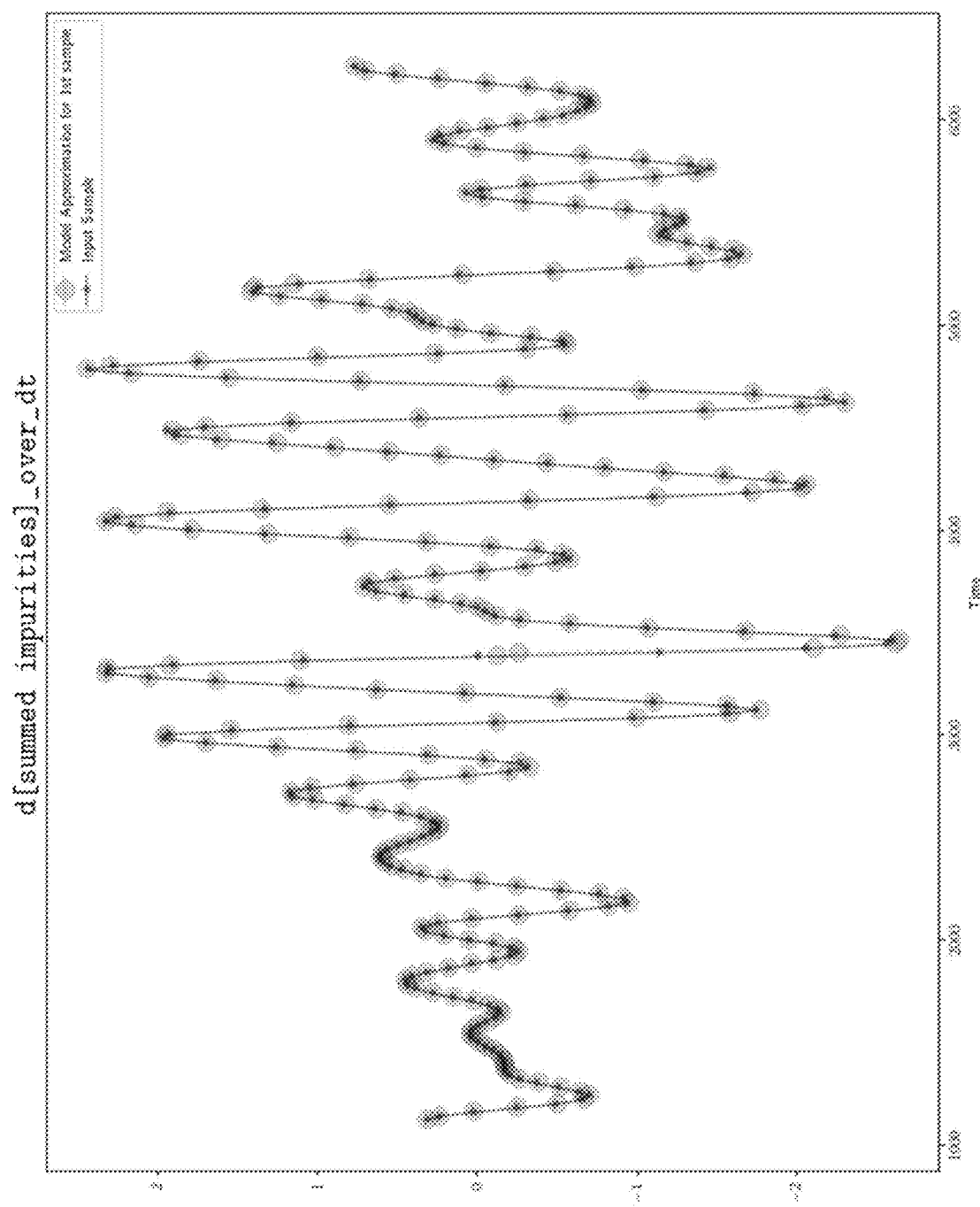
FIG. 8: A second statistical realization (or sample) of the discovered system shown in Equation (1) for the rate of change of the summed impurities in the plasma experiment, where the measured input (i.e. true value) is shown as a solid line marked by stars, and the model approximation is shown as a dashed line marked by circles.

Here I denotes the plasmas "summed impurities," $V_{loop}$ the loop voltage, $P_{inj}$ and $P_{oh}$ denote injected and ohmic heating power, respectively, $T_{top}$ denotes upper triangularity of the device, t denotes time, and $C_1$ through $C_6$ denote real coefficients. In the case of a deterministic system the constants $C_i$ would denote scalars, though here, given multiple realizations from the experiment leading to a stochastic setting, they instead represent random variables, and the resulting distributions they imply. The two plots, FIGS. 7-8, show two separate statistical realizations of the measured rate of the summed impurities, dI/dt, denoted by the starred line compared to the model proposed by the invention (in large circles). Note that the measured signal and the model prediction are effectively identical for all (~300) investigated samples/realizations, even though only one (stochastic) representation/equation is output. In this case the input data was 2 GB, and the output representation (6 terms)*(300 realizations)*(4 bytes per float)*(16 bytes per string)*(8 strings)=~1 MB, a compression ratio of about ~2000. Also note the use of "phase derivatives" in the resulting representation (i.e. equation (1)), such as $\partial I/\partial V_{loop}$. In this case, i.e. equation (1), the outputs terms are formed from a linear combination of first and second order/degree terms comprised of degree one phase derivatives (e.g. as $\partial I/\partial V_{loop}$), first order temporal derivatives (e.g. $\partial V_{loop}/dt$), and first order base variables (e.g. I), leading to a system of differential equations with stochastic coefficients $C_i$ and extremely small residual error.

In some embodiments, input sensitivities on target variables (e.g. temporal derivatives) can lead to high output sensitivities in raw features, which can be quenched (or regularized) by utilizing statistical (e.g. autoregression techniques) and/or modern (e.g. deep neural networks, decisions trees, transformers, etc.) algorithms, making the resulting predictive elements nearly exact. These elements can be used for real time forward predictions on noisy, complex, and even highly-multicollinear data sets.

In some embodiments, when input sensitivities on target variables (e.g. temporal derivatives) have high output sensitivities in raw features, the invention may be nested (multiple times if necessary) in a way such as to "self-regularize," resulting in predictive elements that are nearly exact. These elements may also be used for real time forward predictions on noisy, complex, and even highly-multicollinear data sets.

In some embodiments, the invention allows for extracted representations to be filtered through dimensional analysis techniques, e.g. the Buckingham π methodology, to yield results that are dimensionally consistent with known physical relationships, and easily physically interpreted, recovering known physical laws, or discovering new ones. Similarly, the search space can be made such that only "accepted historical forms" of the output equations are allowed, which can subsequently be used to validate theoretical presuppositions, e.g. which existing theoretical equation representations, such as "first principal models," most effectively match an observed signal, etc.

Another advantage of the present invention is the ability to compress complex functional relationships into symbolic representations, which are, at least within the context of differential mappings, provably parsimonious relative to a chosen validation accuracy and representational framework. This embodiment affords greater flexibility and better functional integration because human brains are not capable of easily understanding computational models, such as Deep Neural Networks that can have many millions of degrees of freedom (even when they are effectively predictive), while human brains are able to understand and intuit systems with only a handful of degrees of freedom. We note here that innovation is very often predicated on human understanding.

Another advantage of the present invention is the various possibilities for the placement of data into the representational framework. Because of flexibility provided by normalization and the automation of data curation techniques, it is possible and natural to apply the system to (almost) any data system that records data, without the need to store the "raw data." This results in the ability to extract high-resolution, actionable understandings of complex systems potentially without infringing on, for example, the DRM of the underlying data set. Thereby the invention not only offers solutions for systems, but may also confer additional types of 'latent access' approaches to privacy preserving machine learning (PPML), homomorphic encryption, differential privacy, and data leakage solutions on proprietary data streams by providing a means of extracting from them only operationally meaningful content.

FIGS. 1-6 illustrate different ways of applying the invention within algorithmic framings. At the top level, the invention provides a way of encoding complex relationships in efficient, parsimonious, interpretable, and highly accurate forms. However, various embodiments of this can lead to a remarkably diverse array of tools and algorithmic ideas, such as different types of Analysis Modules 400, Compression Modules 300, Control Modules 500, Simulation Modules 900, Certification/Hazard/Risk Modules 1100, Decision Modules 1200, and/or Functor Modules 700, to name a few.

FIG. 1 illustrates how the invention is most simply incorporated with a dataset according to one embodiment, where the dataset is retrieved from either a stored database 106 or retrieved from data being actively sampled 102 from a Client Data Module 100, which optionally allows for data updating 108, sampling 104, and resampling 104. The dataset is then sent to the Data Module 200, which embodies the data curation steps often required for Preparing and Cleaning 202, and Processing 204 of the data, e.g. including but not restricted to various Extraction-Transformation-Loading (ETL) approaches. The curated and processed data is then sent to the Compression Module 300, which can first Extract Derived Features from the Data 302, such as spatial, temporal, partial, and phase derivatives, then trains on the processed data to discover Representational Forms 304 that effectively compress the relational mapping implicit in the data to each other. After these mappings have been discovered, Optimal Forms 306 among those discovered are determined, and the resulting parameters to these representational forms are Stored 308, often leading to a massive data compression ratio. The resulting representational forms and stored parameters can then be easily sent to the Analysis Module 400 in order to extract integrated knowledge about the correlative and causal structure of the system.

Figure 2:
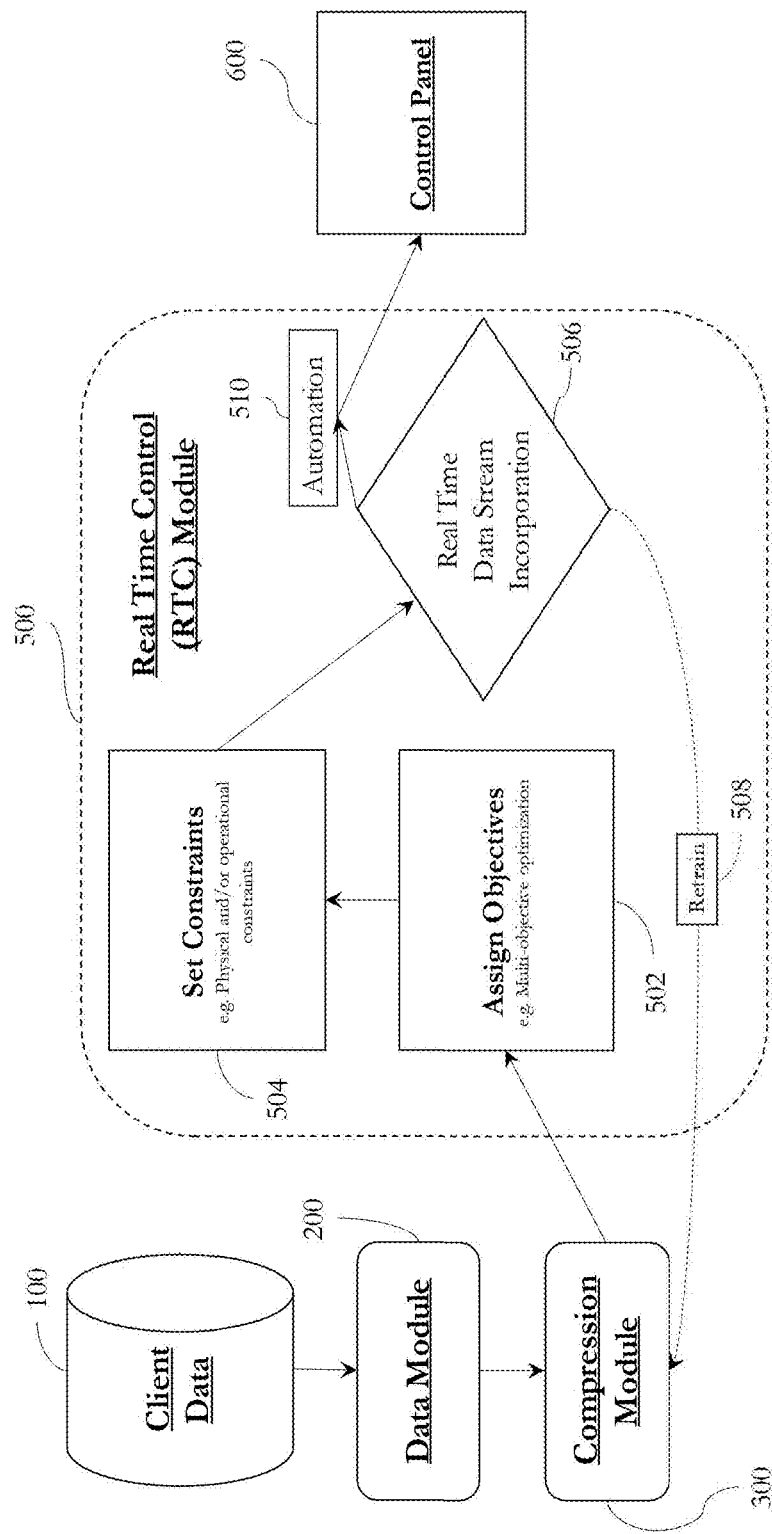
FIG. 2 illustrates how to use the invention in a real time control (RTC) setting, where the Data Module 200 again ports to the Compression Module 300, which is then fed to an RTC Module 500 and optionally, recursively updated.

FIG. 2 illustrates how to use the invention in a real time control setting according to another embodiment wherein, as in FIG. 1, the Client Data 100 is fed into the Data Module 200 for processing, and then to the Compression Module 300 in order to extract the relevant representational forms. These resulting forms are then loaded into a Real Time Control (RTC) Module 500. The first step in the Control Module is often to Assign Objectives 502 for the optimization, then the representational forms allow for the immediate and natural assignment of relevant Constraints 504, whereby constrained optimization may adjoin additional operational constraints to the problem. These systems can then be set up as remarkably efficient single, serial, or multi-objective optimization problems, which can be easily solved in real time due to the massive data compression ratio of the representations discovered by the Compression Module 300, and fed into a Real Time Data Stream 506, that may optionally Retrain 508 by porting back again to the Compression Module 300. The resulting optimization problem can then be used to predict and Automate 510 optimal control in real time, which then must be interfaced to a (usually digitized) Control System (e.g. Control Panel 600) for effective use.

Figure 3:
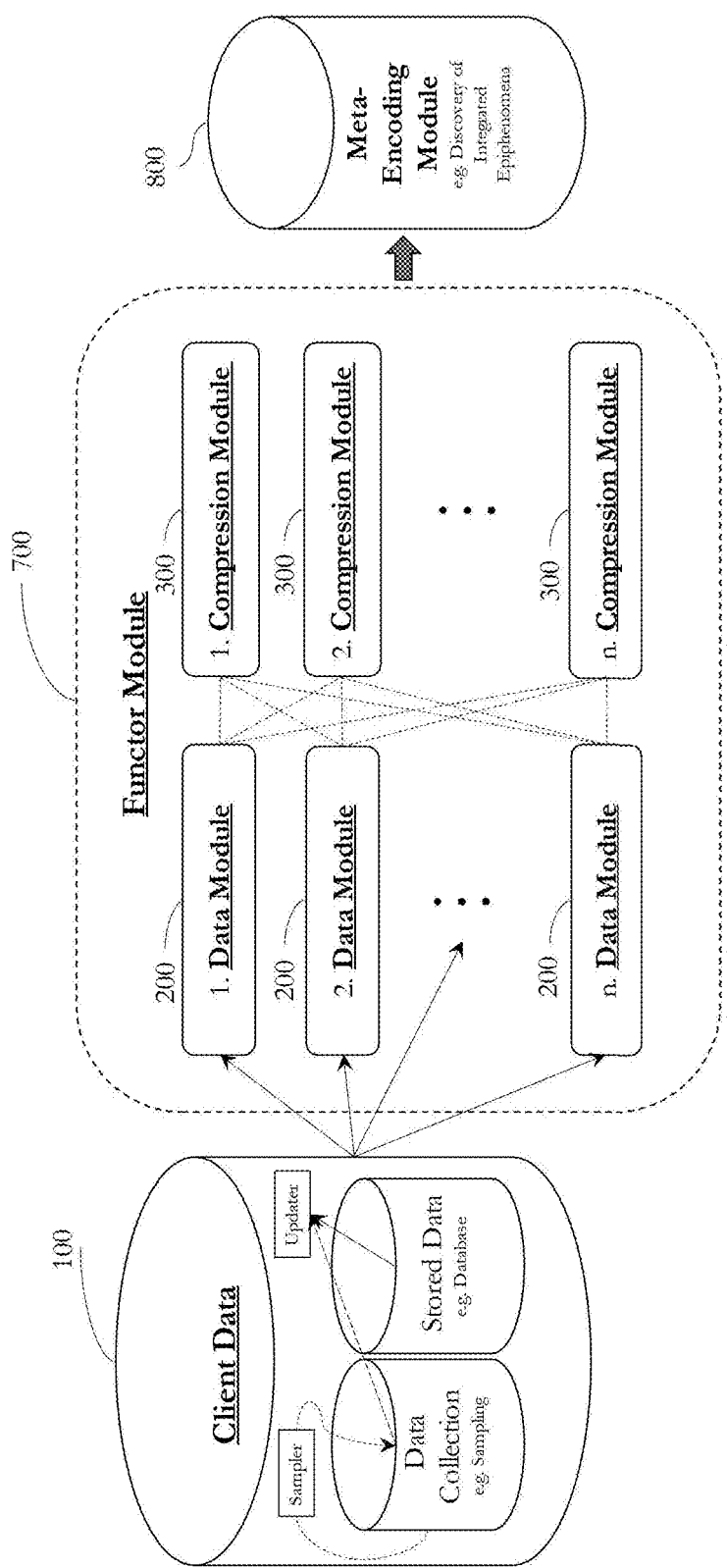
FIG. 3 illustrates how to use the invention in a Functor Module 700 to expose the presence and probabilities of existing integrated epiphenomena emerging between seemingly independent systems, or within (previously considered) independent subsystems presumed to be functionally independent from each other.

FIG. 3 illustrates how to use the invention in the discovery of increasingly more complex and integrated epiphenomena into data analysis frameworks, according to another embodiment. Here, again, the Client Data 100 is fed into Data Modules 200 and Compression Modules 300, respectively, for processing and compression, but now one can take systems of n fundamentally different types and look at them inside of a Functor Module 700. For example, Data Module 1 may be thought to be its own independent system, as is Data Module 2, up to n independent systems, and each corresponding to their own corresponding Compression Modules. However, these systems now, even though seemingly unrelated or only vaguely related as data constructs, may be easily mined for potentially unexpected functorial relationships—using, among other tools, for example, NNs as indicated by the dashed lines in FIG. 3, or Bayesian inference, or random forests, etc.—thus exposing the presence and probabilities of existing integrated epiphenomena emerging between seemingly independent systems, or within (previously considered) independent subsystems that were thought to be functionally independent from each other. These meta-encodings are then stored in a Meta-Encoding Module 800, for further analysis and use.

Figure 4:
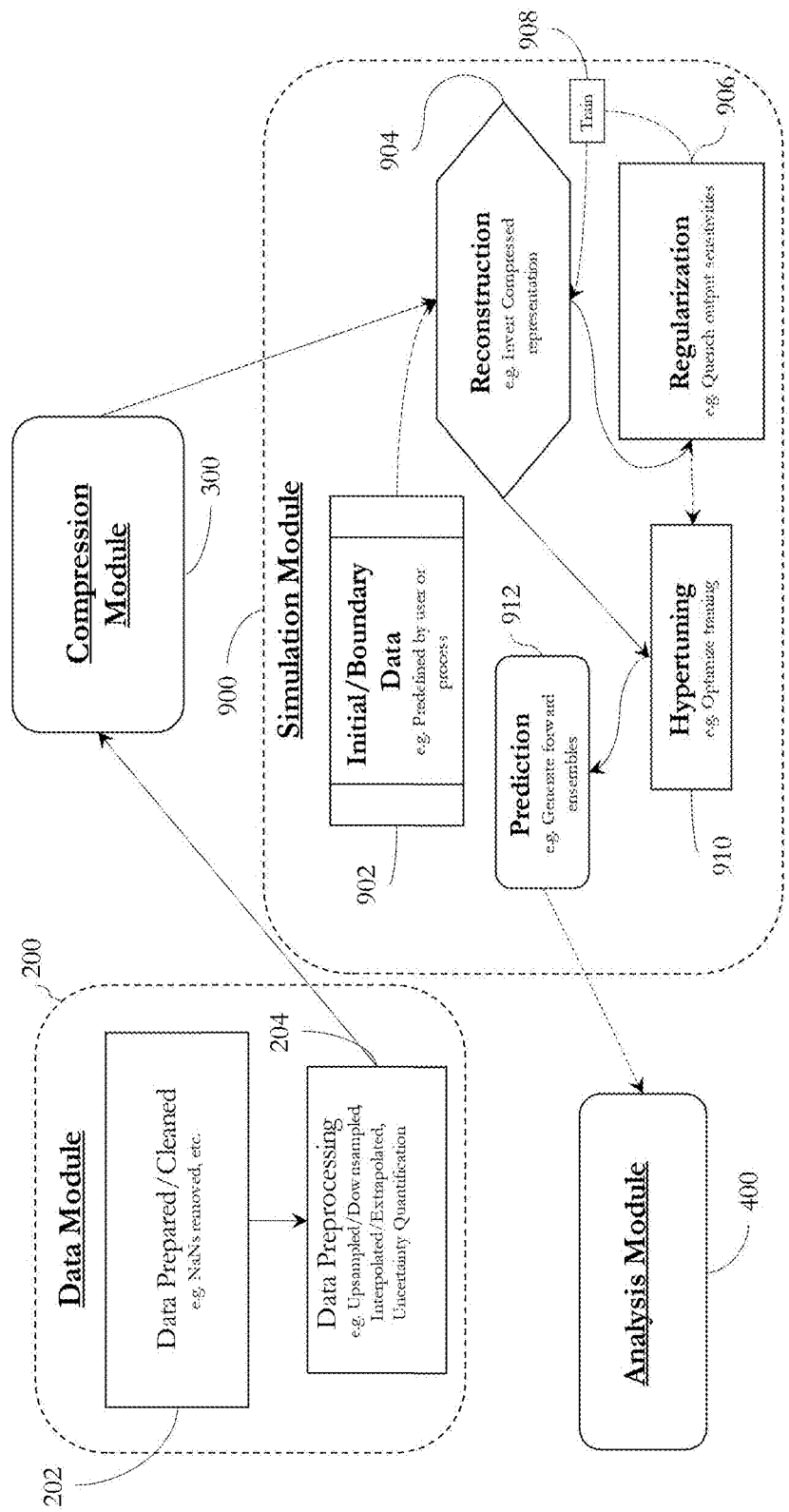
FIG. 4 illustrates how to use the invention in a Simulation Module 900 to develop forward simulations for predicting and assessing the behavior of the discovered representations, and then utilizing these simulations for system analysis.

FIG. 4 illustrates how to use the invention to develop forward simulation models, for predicting and assessing the behavior of the discovered representation. Here, again, the data obtained from the Data Module 200 is then fed into the Compression Modules 300, but now, once the representations have been discovered by the Compression Module 300, these representations are fed into a Simulation Module 900. The user optionally sets any Initial/Boundary Data 902 settings in the Simulation Module 900 and in parallel loads the representation stored in the Compression Module 300. These loaded representations are then Reconstructed using the invertibility of the underlying representational mapping via Reconstruction 904. In order to stabilize the sensitivities in the reconstruction of the original signals from the stored representations, a Regularization 906 step is often required. For example, in time series prediction, this regularization can be performed using classical techniques such as Autoregression, etc., modern techniques such as Neural Networks or Boosted Trees, etc., or it can be—often most effectively—achieved by recursively nesting the invention itself (self-regularization), as indicated by the dotted line (NOTE: this self-regularization requires calling the Compression Module 300 internally and Training 908 it). The (possibly regularized) reconstruction is then Hypertuned 910 using, for example, Bayesian optimization, random or grid searches, evolutionary algorithms, tree-structured Parzen estimators, hyperbanding, gradient-based optimization, etc., in order to generate robust Predictions 912, which can be stored and/or propagated forward in the simulation. The resulting Predictions 912 can then be loaded into the Analysis Module 400 for further deep analysis and evaluation.

Figure 5:
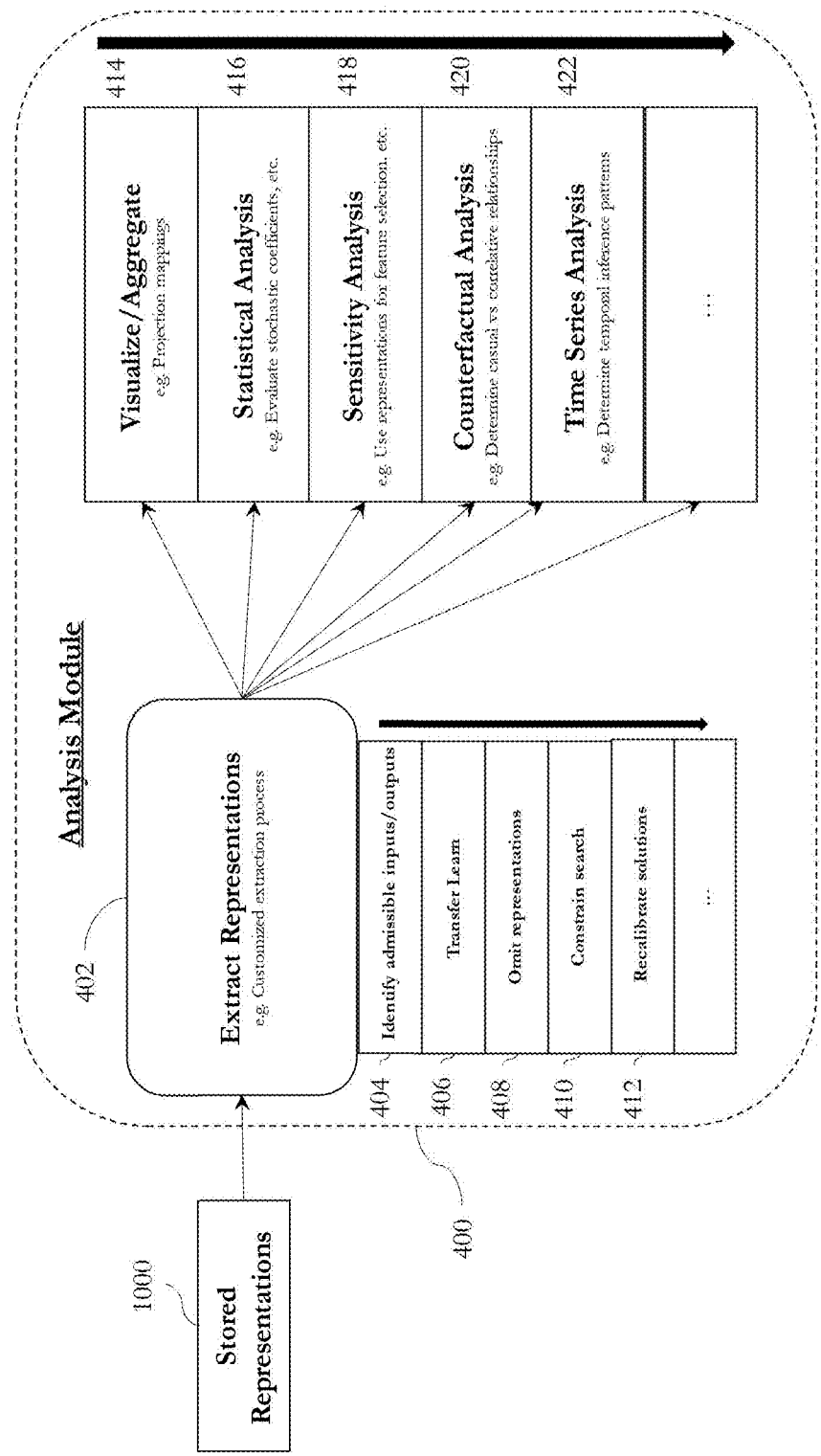
FIG. 5 illustrates how to use the invention in an Analysis Module 400 as a deep and expansive analysis tool, for visualization, statistical and sensitivity analysis, counterfactual and time/space series analysis, etc.

FIG. 5 illustrates how to use the invention as an analysis tool. The Analysis Module 400 takes Stored Representations as input, which can come from the Data Module 200, Compression Module 300, Simulation Module 900, Functor Module 700, or any other module, or interface, capable of outputting the inventions representational equations. These are loaded into the Analysis Module 400 for further evaluation. Once these representations have been loaded into the module, they may be adapted in various ways, such as by Identifying admissible inputs/outputs 404, Transfer Learning 406 onto a new—or related—collections of data, Omitting (or isolating) 408 specific terms in the representation, Constraining the optimization search 410 to a subset of the data, and/or Recalibrating 412 the solutions using various recalibrations tools, such as linear regression or remote sensing. The resulting Extracted Representations 402 may then be used to run a large number of analysis procedures in the Analysis Module 400, including but not limited to Visualization and Aggregations techniques 414, Statistical Analysis 416 on the discovered representations, Sensitivity Analysis 418 on the discovered representations, Counterfactual Analysis 420, and Time Series Analysis 422.

Figure 6:
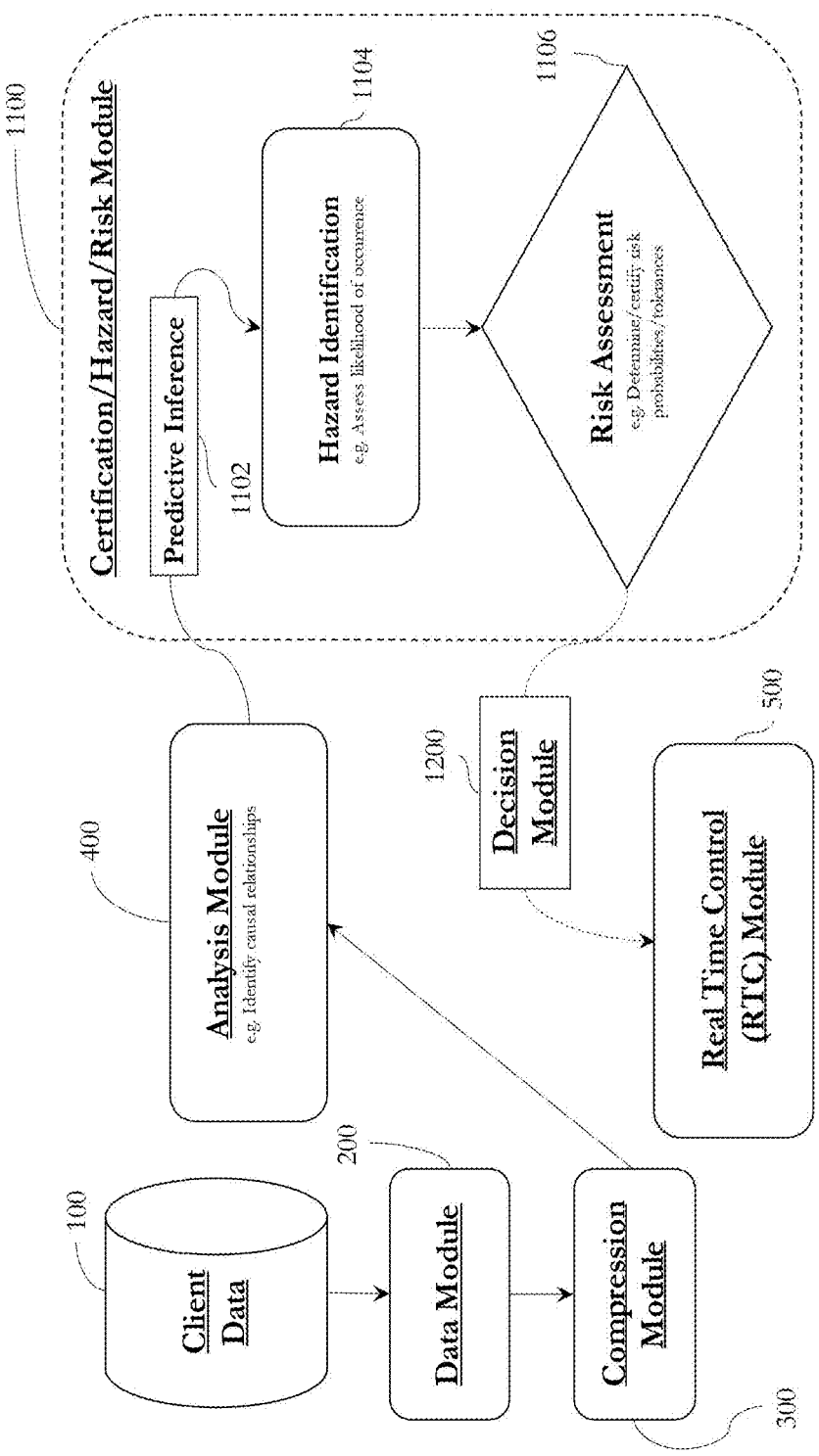
FIG. 6 illustrates how to use the invention for certification and risk analysis in a Certification/Hazard/Risk Module 1100, which can be optionally ported through the RTC Module 500.

FIG. 6 illustrates how to use the invention for certification and/or risk analysis. In this embodiment, the Client Data 100 is fed into the Data Module 200 for processing, and then to the Compression Module 300 as before. The resulting representations are then loaded into the Analysis Module 400 for evaluation of the statistical properties of the output representations. This information is then ported to the Certification/Hazard/Risk Module 1100, where first Predictive Inference 1102 can be performed on the Analysis Modules outputs, that is naturally utilized to assess the likelihood, and/or various aspects of the statistical probability and tolerances of some particular event (e.g. a hazard) occurring. This event or hazard evaluation is then used to assess the risk the prediction is conditioned on, i.e. how much uncertainty there is in the prediction relative to the known behavior of the system adjoined to the actual prediction given, and assessed in the Risk Assessment 1106 step. The resulting certification can then be ported to a Decision Module 1200 that assesses the admissible risk tolerances of the operation, which can then, for example, be used in the RTC Module for automating real time processes.

The present invention provides a means to compress and represent complex data relationships into compact forms. However, various alternative embodiments may include using these representational forms to not only understand more precisely how systems work, but to develop broader understandings of how inter-related systems compare, and/or how to abstract and encapsulate real and complex high-order epiphenomena efficiently.

Similarly, while the present invention has been described herein as an algorithmic apparatus and means for compressing and interpreting data, the present invention may be readily used in any number of existing software toolchains or other similar devices now known or hereafter developed.

Finally, while the present invention has been described above with reference to various exemplary embodiments, many changes, combinations, and modifications may be made to the exemplary embodiments without departing from the scope of the present invention. For example, the various components may be implemented in alternative ways. These alternatives can be suitably selected depending upon the particular application or in consideration of any number of factors associated with the operation of the device. In addition, the techniques described herein may be extended or modified for use with other types of devices. These and other changes or modifications are intended to be included within the scope of the present invention.

What is claimed:

1. A system identification method for extracting deep latent relationships present within multimodal and/or multidimensional data, by identifying underlying dynamic and variational relationships present within, and among, data subgroupings, the method comprising:
   identifying targets (variables, vectors, or data subsets) in multimodal, multidimensional, and/or multi-dimensionalizable data sets to find representations of the target in terms of the other modes, or data subgroupings, from the full data set;
   extracting representations in the form of either dependent and/or independent variables of simple algebraic form and order, along with their integrals along varying dimensions or dependencies, and their derivatives with respect to each other (including temporal, spatial, partial, and/or "phase derivatives" of low degree);
   using the extracted representations to discover parsimonious (or near parsimonious) representations of the input data, in the expression of simple differential-type equations; and
   encoding and storing the parsimonious representations for later retrieval, data reconstruction, analysis, and/or downstream use.

2. A data discovery method for compressing and encoding relational aspects of high-dimensional, highly-interdependent, largely-independent, multimodal, and/or nonlinear data systems, the method comprising:
   identifying targets (variables, vectors, or data subsets) in multimodal, multidimensional, and/or multi-dimensionalizable data sets to find representations of the target in terms of the other modes, or data subgroupings, from the full data set;
   developing a comprehensive dependency tree (including both dependent and independent variables of arbitrary algebraic form and order, their integrals along varying dimensions, and their derivatives with respect to each other, such as temporal, spatial, partial, and/or "phase derivatives" of arbitrary order and/or mixed degree);
   extracting deep (potentially non-intuitive) latent representations present in the data in the form of complex differential-type encodings, including at least one of partial differential equations (PDEs), ordinary differential equations (ODEs), stochastic differential equations (SDEs), dynamical systems, PDEs with stochastic coefficients and constant terms, algebraic differential equations (ADEs), and integro-differential equations;
   using the extracted representations to discover parsimonious (or near parsimonious) representations of the input data, in the expression of complex differential-type equations; and
   encoding and storing the parsimonious representations for later retrieval, data reconstruction, analysis, and/or downstream use.

3. The method of claim 2, further comprising performing transfer learning between similar, or seemingly disparate data systems, in order to transfer knowledge from one domain knowledge area to another.

4. A numerical compression method for extracting derived, latent features from multidimensional (or multi-dimensionalizable) data sets, the method comprising:
   identifying targets (variables, vectors, or data subsets) in multimodal, multidimensional, and/or multi-dimensionalizable data sets to find representations of the target in terms of the other modes, or data subgroupings, from the full data set;
   extracting representations in the form of either dependent and/or independent variables of simple algebraic form and order, along with their integrals along varying dimensions or dependencies, and their derivatives with respect to each other (including temporal, spatial, partial, and/or "phase derivatives");
   using the extracted representations to discover parsimonious (or near parsimonious) representations of the input data, in the expression of simple differential-type equations; and encoding and storing the parsimonious representations for later retrieval, data reconstruction, analysis, and/or downstream use;
   transforming extracted representations into digitized versions of numerical and symbolic representations;
   extracting the deep relationships in the data encoded into families of differential-style equations and the coinciding residuals associated to the numerical approximations representing differential and integral forms;
   generating computationally invertible mappings between the forward and reverse numerical and algebraic representations of the differential and integro-differential forms from the extracted representations;
   training the representational numerical forms of the extracted representations to be substantially parsimonious, relative to user assigned constraints, limits, or in-built assumptions;
   optimizing the representational numerical forms to balance the needs of the application at hand; and
   storing the optimal representations for later use.

5. The method of claim 4 wherein the prescribed efficiency of the encoding of the data relationships leads to theoretical parsimony limits relative to optimal data validation, and thus unique, novel, and non-degenerate representations of complex data systems.

6. The method of claim 4, wherein transfer learning is performed between similar, or seemingly disparate data systems, in order to transfer knowledge from one domain knowledge area to another.

7. The method of claim 4, wherein re-calibration, tuning, and/or hypertuning is performed to find more optimal representations of the data system, leading to better compression ratios (greater parsimony), more accurate predictions, and greater levels of conceptual insight into the data system under consideration.

8. The method of claim 4 further comprising:
   visualizing and aggregating for extracting information and or knowledge about the system;
   statistically analyzing the resulting statistical data representations;
   analyzing the sensitivities in the resulting data representations;
   performing counterfactual analysis on the resulting data representations, to determine the relationships implicit in the data system as revealed by the resulting data representations;
   prescribing data anomalies, cluster locations, and predictive tendencies in the resulting data representations; and
   performing dimension reduction techniques for comparison and analysis.

9. The method of claim 4, further comprising:
   assigning of control objectives;
   setting operational constraints on the objective function;
   updating the datastream with new data, as it is acquired;
   retraining the representations based on the new data coming from the datastream update; and automating the control processes in real time, or on time horizons pertinent to the evolution or decision timeframe of the data systems under consideration.

10. The method of claim 4, further comprising:
extracting inter-related features of the system;
encapsulating real and complex high-order epiphenomena efficiently; and
storing the discovered integrated epiphenomena into a Meta-Encoding Module.

11. The method of claim 4, further comprising:
reconstructing, the data predicted from the stored representation; and
running forward simulations that can be used to predict and/or analyze system behavior.

12. The method of claim 4, further comprising:
collecting and loading the predictive inference and statistical properties gathered in the Analysis Module;
identifying the likelihood, and/or probabilities, of unplanned or undesirable events occurring in the system generating the data;
assessing the uncertainty in the predicted event probability relative to known, or ideal, behaviors of the system generating the data;
deciding on admissible risk tolerances for a performed operation; and
automating risk assessment and decision making.

13. A numerical compression method for extracting derived, latent features from multidimensional (or multidimensionalizable) data sets, the method comprising:
identifying targets (variables, vectors, or data subsets) in multimodal, multidimensional, and/or multi-dimensionalizable data sets to find representations of the target in terms of the other modes, or data subgroupings, from the full data set;
developing a comprehensive dependency tree (including both dependent and independent variables of arbitrary algebraic form and order, their integrals along varying dimensions, and their derivatives with respect to each other, such as temporal, spatial, partial, and/or "phase derivatives" of arbitrary order and/or mixed degree);
extracting deep (potentially non-intuitive) latent representations present in the data in the form of complex differential-type encodings, including at least one of partial differential equations (PDEs), ordinary differential equations (ODEs), stochastic differential equations (SDEs), dynamical systems, PDEs with stochastic coefficients and constant terms, algebraic differential equations (ADEs), and integro-differential equations;
using the extracted representations to discover parsimonious (or near parsimonious) representations of the input data, in the expression of complex differential-type equations; and encoding and storing the parsimonious representations for later retrieval, data reconstruction, analysis, and/or downstream use;
transforming extracted representations into digitized versions of numerical and symbolic representations; extracting the deep relationships in the data encoded into families of differential-style equations and the coinciding residuals associated to the numerical approximations representing differential and integral forms;
generating computationally invertible mappings between the forward and reverse numerical and algebraic representations of the differential and integro-differential forms from the extracted representations;
training the representational numerical forms of the extracted representations to be substantially parsimonious, relative to user assigned constraints, limits, or in-built assumptions;
optimizing the representational numerical forms to balance the needs of the application at hand; and
storing the optimal representations for later use.

14. The method of claim 13 wherein the prescribed efficiency of the encoding of the data relationships leads to theoretical parsimony limits relative to optimal data validation, and thus unique, novel, and non-degenerate representations of complex data systems.

15. The method of claim 13, wherein transfer learning is performed between similar, or seemingly disparate data systems, in order to transfer knowledge from one domain knowledge area to another.

16. The method of claim 13, wherein re-calibration, tuning, and/or hypertuning is performed to find more optimal representations of the data system, leading to better compression ratios (greater parsimony), more accurate predictions, and greater levels of conceptual insight into the data system under consideration.

17. The method of claim 13 further comprising:
visualizing and aggregating for extracting information and or knowledge about the system;
statistically analyzing the resulting statistical data representations;
analyzing the sensitivities in the resulting data representations;
performing counterfactual analysis on the resulting data representations, to determine the relationships implicit in the data system as revealed by the resulting data representations;
prescribing data anomalies, cluster locations, and predictive tendencies in the resulting data representations; and
performing dimension reduction techniques for comparison and analysis.

18. The method of claim 13, further comprising:
assigning of control objectives;
setting operational constraints on the objective function;
updating the datastream with new data, as it is acquired;
retraining the representations based on the new data coming from the datastream update; and
automating the control processes in real time, or on time horizons pertinent to the evolution or decision timeframe of the data systems under consideration.

19. The method of claim 13, further comprising:
extracting inter-related features of the system;
encapsulating real and complex high-order epiphenomena efficiently; and
storing the discovered integrated epiphenomena into a Meta-Encoding Module.

20. The method of claim 13, further comprising:
reconstructing the data predicted from the stored representation; and
running forward simulations that can be used to predict and/or analyze system behavior.

21. The method of claim 13, further comprising:
collecting and loading the predictive inference and statistical properties gathered in the Analysis Module;
identifying the likelihood, and/or probabilities, of unplanned or undesirable events occurring in the system generating the data;
assessing the uncertainty in the predicted event probability relative to known, or ideal, behaviors of the system generating the data;

deciding on admissible risk tolerances for a performed operation; and automating risk assessment and decision making.

\* \* \* \* \*